United States Patent [19]
Reis et al.

[11] Patent Number: 4,972,102
[45] Date of Patent: Nov. 20, 1990

[54] SINGLE-ENDED SENSE AMPLIFIER WITH DUAL FEEDBACK AND A LATCHING DISABLE MODE THAT SAVES POWER

[75] Inventors: Richard Reis; R. A. Garibay, Jr.; Jesse R. Wilson, all of Austin, Tex.

[73] Assignee: Motorola, Inc., Schaumburg, Ill.

[21] Appl. No.: 348,927

[22] Filed: May 8, 1989

[51] Int. Cl.$^5$ ............................................. H03K 19/094
[52] U.S. Cl. ...................................... 307/451; 307/449; 307/530
[58] Field of Search ..................... 307/530, 296.3, 448, 307/451, 455, 464, 465, 473, 449

[56] References Cited

U.S. PATENT DOCUMENTS

| | | | |
|---|---|---|---|
| 3,579,272 | 5/1971 | Foss | 307/455 |
| 3,946,246 | 3/1976 | Marley | 307/455 |
| 4,445,051 | 4/1984 | Elmasry | 307/448 |
| 4,479,067 | 10/1984 | Fujita | 307/448 |
| 4,649,294 | 3/1987 | McLaughlin | 307/451 |
| 4,754,173 | 6/1988 | Smith et al. | 307/455 |
| 4,808,851 | 2/1989 | Chantepie | 307/448 |
| 4,849,658 | 7/1989 | Iwamura et al. | 307/443 |

FOREIGN PATENT DOCUMENTS 0003160 1/1978 Japan .................... 307/448

Primary Examiner—Stanley D. Miller
Assistant Examiner—T. Cunningham
Attorney, Agent, or Firm—James L. Clingan, Jr.

[57] ABSTRACT

An integrated circuit is disclosed with a logic network having an output coupled to a sense node and having a virtual ground node, and with a sense amplifier having a sensing circuit coupled to the sense node to provide an output signal, charging and discharging feedback circuits coupled to the sense node that limit the swing of the sense amplifier, and an enable control to enable and disable the sense amplifer. In one embodiment in a CMOS integrated circuit a parallel network of n-channel transistors has an output connected to a sense node of a sense amplifier. A sensing inverter and a feedback inverter are connected to this sense node. The switchpoint of the feedback inverter is substantially higher than the switchpoint of the sensing inverter. A charging n-channel transistor is connected between the sense node and a power supply for charging the sense node, and the output of the feedback inverter is connected to the gate of the charging transistor. A discharging n-channel transistor is connected in series between the parallel network and ground. The gate of the discharging transistor is coupled to the sense node. The sense amplifier can enter a power-saving disable mode, and entry is controlled by a sense amplifier enable signal. This mode has two possible states corresponding to the state of the sense amplifier immediately preceding disablement and enables the sense amplifier to avoid output glitches when leaving the disabled mode. The sense amplifier uses two negative feedback loops, including the charging and discharging n-channel transistors, to limit the swing on the sense node, and this swing is substantially independent of the number of parallel transistors that are conductive.

9 Claims, 1 Drawing Sheet

SINGLE-ENDED SENSE AMPLIFIER WITH DUAL FEEDBACK AND A LATCHING DISABLE MODE THAT SAVES POWER

BACKGROUND OF THE INVENTION

This invention relates generally to an integrated circuit, and more specifically to an improved sense amplifier for use in an integrated circuit such as a memory or microprocessor chip.

In integrated circuits, transistors are frequently connected together into a network used for performing a logic function. This logic network will have several inputs, each input having a high or low voltage corresponding to binary logic states of logic high or logic low respectively, and will have an output having a voltage likewise corresponding to a binary logic state. This logic network is designed so that the output is a logical function of the inputs, and this function is established by the design of the logic network.

A common configuration for such a logic network is found in a programmable logic array (PLA) for a microprocessor. In a typical NOR PLA, as used in an MOS integrated circuit, many insulated gate field effect transistors (IGFETs) will be connected in parallel such that all drains are tied to a common output node and all sources are tied to a common virtual ground node (this virtual ground node provides a logic low reference for the network). This parallel network of IGFETs forms a row in the PLA. A typical PLA contains many such rows, and each row, for example, may consist of 32 or more IGFETs. A PLA row with parallel transistors provides a NOR logic function such that if one or more of the transistors in the row is conductive, then the row output will fall to a low voltage corresponding to a logic low due to discharging of the row output node by the conductive transistor(s); otherwise, the row output node will not be discharged and will remain at a high voltage corresponding to a logic high. This type of parallel transistor network is also commonly found in read-only memories (ROMs) and in other circuits requiring a NOR logic function with many inputs, for example zero-detect networks.

The output of a large parallel transistor network, such as used in a PLA or a ROM, is usually connected to a single-ended sense amplifier used to sense, or read, the logic state of the output as either a logic high or a logic low by detecting either a high or low voltage on the output. The common virtual ground node connected to the parallel transistors is usually connected to ground by a load transistor. Due to the large number of parallel transistors connected to a common output node, the capacitance of the output node slows output voltage changes considerably. Therefore, a limited-swing sense amplifier is frequently used to sense the output over a narrow voltage range, or swing, of say one or two volts and, thereby, increase sensing speed.

When using a limited-swing sense amplifier, the switchpoint of the amplifier must be approximately centered in the voltage swing of the output to be sensed. This is achieved by designing the sense amplifier to match the expected range of current through the logic network to be sensed. Because none, one, several, or all of the transistors in a parallel transistor network can be conductive, a sense amplifier used to sense the output of such a network must be designed to handle a wide current range. Prior sensing methods have relied upon a load transistor connected between a virtual ground node and a power supply ground node in order to limit current and thereby reduce the current range that must be handled by the sense amp. In previous circuits the control terminal of this load transistor has been connected to a constant voltage source or to a current terminal of the load transistor. Both of these approaches are not sufficiently adaptive to this wide current range, fail to significantly reduce this current range, and force the sense amplifier to be over-designed resulting in a waste of layout area on the integrated circuit. Also, the excessive current range associated with these prior approaches prevents adequate design control when positioning the switchpoint of the sense amplifier within the limited voltage swing of the logic network output, and therefore the response and noise margin of the sense amplifier vary excessively and unpredictably.

Other disadvantages of previous limited-swing sense amplifiers include the use of depletion transistors and the use of the same inverter for both sensing and feedback. Depletion devices are not available in typical CMOS integrated circuit processes. Using the same inverter to provide a feedback signal and to sense the logic state of a sense amplifier's input prevents the independent optimization of these two functions and therefore limits improvements in sensing speed.

The power consumption during a sensing operation of most limited-swing sense amplifiers is usually significant relative to other circuitry on an integrated circuit. Therefore, most sense amplifiers have been provided with a means for disablement such that power consumption is reduced significantly when no sensing is required. However, previous sense amplifiers have been designed with an arbitrary disable mode unresponsive to the state of the sense amplifier immediately preceding disablement. Often, during the operation of an integrated circuit, the inputs to a logic network having an output connected to a sense amplifier will not change during the disablement of the sense amplifier. In these cases it is desirable that the internal state of the sense amplifier, not just the output of the sense amplifier, be maintained while in the disabled mode. Previous sense amplifiers have not maintained this internal state and therefore have frequently suffered from noise glitches in the amplifier output when leaving the disabled mode.

Accordingly, a need exists for a sense amplifier to handle loads with a wide current range that retains stable response and adequate noise margin.

BRIEF SUMMARY OF THE INVENTION

It is therefore an object of this invention to provide an improved sense amplifier for an integrated circuit.

It is a further object of this invention to provide an improved sense amplifier adaptive to a wide, varying range of current loads.

It is still a further object of this invention to provide an improved sense amplifier with stable response to a wide range of current loads.

Still another object of this invention is to provide an improved sense amplifier that does not use depletion transistors and is readily integrated into a CMOS process.

The foregoing and other objects and advantages of the present invention are achieved in an integrated circuit with a logic network having an output coupled to a sense node and having a virtual ground node, and with a sense amplifier having a sensing circuit coupled to the sense node to provide an output signal, charging and discharging feedback circuits coupled to the sense node that limit the swing of the sense amplifier, and an enable control to enable and disable the sense amplifier. In one embodiment in a CMOS integrated circuit a parallel network of n-channel transistors has an output connected to a sense node of a sense amplifier. A sensing inverter and a feedback inverter are connected to this sense node. The switchpoint of the feedback inverter is substantially higher than the switchpoint of the sensing inverter. A charging n-channel transistor is connected between the sense node and a power supply for charging the sense node, and the output of the feedback inverter is connected to the gate of the charging transistor. A discharging n-channel transistor is connected in series between the parallel network and ground. The gate of the discharging transistor is coupled to the sense node. The sense amplifier can enter a power-saving disable mode, and entry is controlled by a sense amplifier enable signal. This mode has two possible states corresponding to the state of the sense amplifier immediately preceding disablement and enables the sense amplifier to avoid output glitches when leaving the disabled mode.

DETAILED DESCRIPTION OF THE PREFERRED EMBODIMENTS

Figure 1:
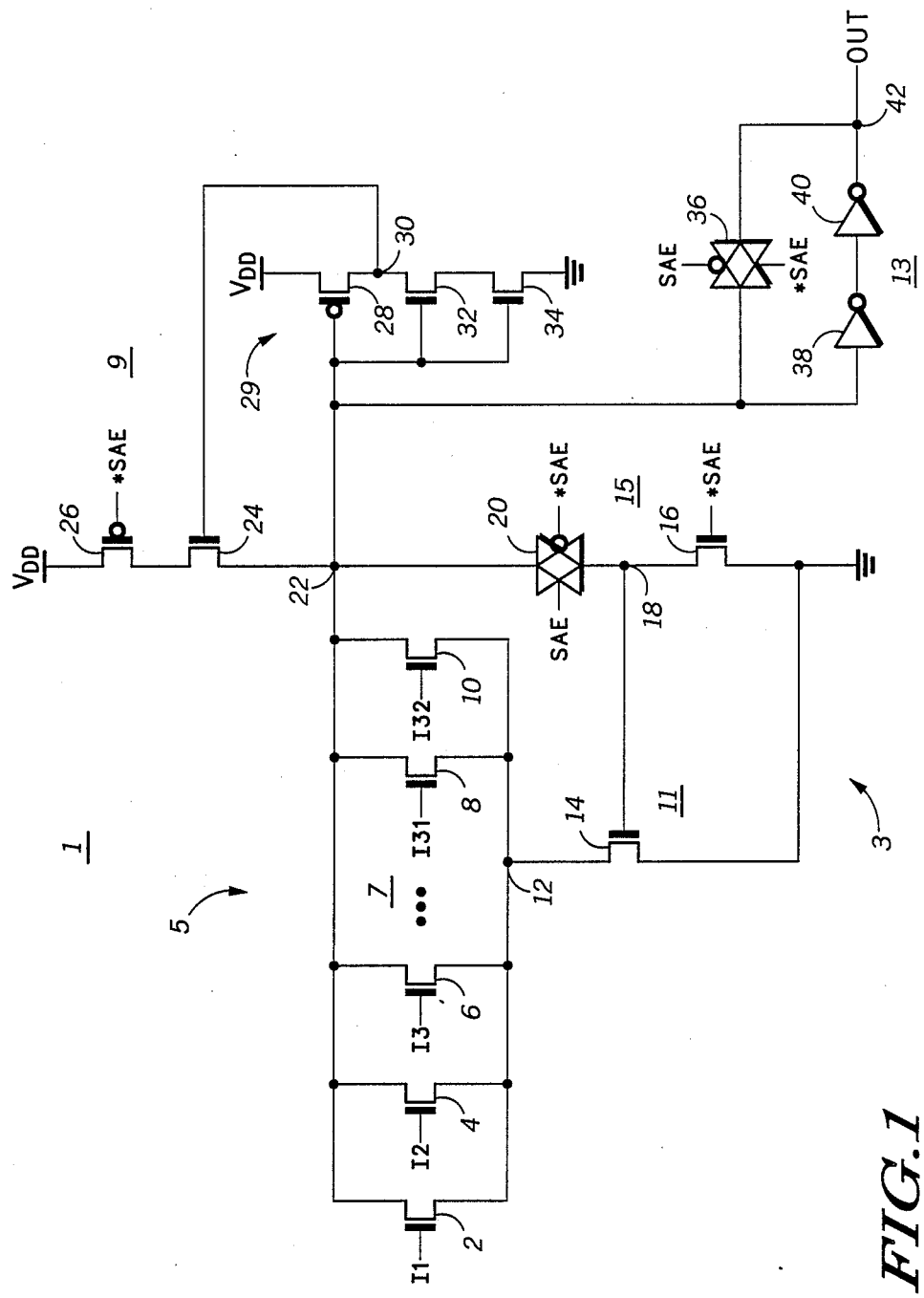
FIG. 1 illustrates, in a schematic diagram, a preferred embodiment of a sense amplifying circuit for a parallel transistor network in a CMOS integrated circuit.

FIG. 1 illustrates a portion 1 of a CMOS integrated circuit comprising generally a single-ended sense amplifier 3 and a parallel transistor logic network 5. Only p-channel and n-channel enhancement transistors are used in this embodiment; no depletion transistors are necessary. Logic network 5 is comprised of transistors 2, 4, 6, 8, and 10 having inputs I1, I2, I3, I31, and I32, as shown, and of 27 other transistors likewise in parallel and not shown, the absence in FIG. 1 thereof indicated by an ellipsis 7. Sense amplifier 3 is comprised generrlly of a charging feedback circuit 9, a discharging feedback circuit 11, a sensing circuit 13, and an enable control circuit 15. Charging feedback circuit 9 comprises a transistor 24 and an inverter 29. Inverter 29 comprises transistors 28, 32, and 34. Discharging feedback circuit 11 comprises transistor 14. Sensing circuit 13 comprises inverters 38 and 40 and provides an output signal (OUT) from sense amplifier 3. Enable control circuit 15 comprises n-channel transistor 16, p-channel transistor 26, and transmission gates 20 and 36. A sense amplifier enable signal (SAE) and its complement (*SAE) act in unison to control the enabling and disabling of sense amplifier 3. All of the devices having SAE or *SAE as an input are used for enabling or disabling sense amplifier 3 and comprise transistors 16 and 26, and transmission gates 20 and 36.

Describing logic network 5 of FIG. 1 in more detail, logic network 5 comprises 32 n-channel transistors connected in parallel and each having independent gate inputs numbered consecutively from I1 to I32 and used to switch these transistors between conductive and non-conductive states, or on and off. Of these 32 transistors, five are shown in FIG. 1, consisting of n-channel transistors 2, 4, 6, 8, and 10, with the connection for the remaining 27 transistors, not shown, indicated by ellipsis 7. All 32 transistors in logic network 5 have their drains connected in common to a sense node 22 and have their sources connected in common to a virtual ground node 12. Sense node 22 acts as the logic output for logic network 5, and as the input for sense amplifier 3.

Describing the sensing and feedback means of sense amplifier 3 in more detail, inverter 38 has an input connected to sense node 22, and an output. Inverter 40 has an input connected to the output of inverter 38, and an output connected to a node 42 which provides signal OUT. Inverter 29 has an input connected to node 22 and an output connected to a node 30. P-channel transistor 28 and n-channel transistors 32 and 34 each have gates connected to sense node 22. Transistor 28 has a source connected to a power supply (VDD) and a drain connected to node 30. Transistor 32 has a drain connected to node 30 and a source. Transistor 34 has a drain connected to the source of transistor 32 and a source connected to ground.

In the preferred embodiment the switchpoint of feedback inverter 29 is greater than the switchpoint of sensing inverter 38. This is due to the relative sizing of the devices used in inverters 29 and 38. In inverter 29, the width-to-length ratio for transistor 28 is twice that of transistor 32, and transistor 34 has the same ratio as transistor 32. The n-channel device and p-channel device used in inverter 38 have the same width-to-length ratio. The higher switchpoint of inverter 29 is necessary to establish an appropriate swing on sense node 22 relative to the switchpoint of inverter 38 and to maintain adequate noise margin for varying CMOS device processing conditions.

N-channel transistor 24 has a source connected to sense node 22, a gate connected to node 30, and a chain. Charging transistor 24 charges sense node 22 during operation of sense amplifier 3, and this charging is modulated by negative feedback from sense node 22 via feedback inverter 29. N-channel transistor 14 has a drain connected to virtual ground node 12, a source connected to ground, and a gate connected to a node 18. Transistor 14 controls discharging of sense node 22 through logic network 5, and this discharging is modulated by negative feedback coupled from sense node 22 to node 18.

Continuing with a detailed description of the devices used for enabling and disabling sense amplifier 3 of FIG. 1, p-channel transistor 26 has a source connected to VDD, a drain connected to the drain of charging transistor 24, and a gate for receiving signal *SAE. Transistor 26 is switched on by signal *SAE when sense amplifier 3 is enabled to provide power, but is switched off by signal *SAE when sense amplifier 3 is disabled in order to reduce power consumption. N-channel transistor 16 has a source connected to ground, a drain connected to node 18, and a gate for receiving signal *SAE. A feedback transmission gate 20 has a first input/output (I/O) terminal connected to sense node 22, a second I/O terminal connected to node 18, and true and complementary control inputs for receiving signals SAE and *SAE, respectively. When sense amplifier 3 is enabled, transistor 16 is switched off by signal *SAE, and transmission gate 20 is switched on by signals SAE and *SAE completing a conductive feedback path between sense node 22 and node 18. But when sense amplifier 3 is disabled, transistor 16 is switched on, transmission gate 20 is switched off, and transistor 16 discharges node 18 to switch off discharging transistor 14. Transmission gate 36 has a first I/O terminal connected to sense node 22, a second I/O terminal connected to node 42, and true and complementary control inputs for receiving signals *SAE and SAE, respectively. When sense amplifier 3 is enabled, transmission gate 36 is switched off, but when sense amplifier 3 is disabled, transmission gate 36 is switched on forming a conductive connection enabling inverter 40 to latch signal OUT onto sense node 22.

The sense amplifier 3 of FIG. 1 is designed to detect the logic state of sense node 22 as either a logic high or a logic low, corresponding to either a high voltage or a low voltage on node 22 respectively. When sense amplifier 3 is enabled, the voltage on sense node 22 ($V_{22}$) will not switch over the full range between VDD and ground because the two self-biasing feedback loops described previously will limit the swing of $V_{22}$ to about 1V (sense amplifier 3 is a limited-swing amplifier). During sensing, $V_{22}$ will reach a high voltage ($V_{high}$) of about 2.7V and a low voltage ($V_{low}$) of about 1.7V depending on the conductive state of logic network 5. Sense amplifier 3 provides amplified signal OUT having a logic state corresponding to $V_{22}$. However, the voltage of signal OUT ($V_{OUT}$) will have a full swing and switch between VDD and ground, or rail-to-rail, because inverter 40 has a switchpoint of about 2.2V, and the input thereof will be substantially above or below this switchpoint. For example, if $V_{22}$ is at $V_{high}$, then $V_{OUT}$ will be at VDD, and if $V_{22}$ is at $V_{low}$, then $V_{OUT}$ will be at ground.

In preparation for sensing by sense amplifier 3, signal SAE is at a high voltage or logic high and signal *SAE is at a low voltage or logic low, thereby enabling sense amplifier 3 by biasing p-channel transistor 26 on, n-channel transistor 16 off, feedback transmission gate 20 on, and transmission gate 36 off. If all inputs I1 to I32 to logic network 5 are at a logic low, then all of the parallel transistors in logic network 5 are off. Sense node 22 is at a quiescent voltage of $V_{high}$, and charging transistor 24 is biased partially on by the output of feedback inverter 29. Node 18 is at substantially the same voltage as sense node 22, and discharging transistor 14 is biased partially on. The voltage on virtual ground node 12 ($V_{12}$) us pulled down to ground by transistor 14. However, no current flows from sense node 22 to ground through discharging transistor 14 because all transistors in logic network 5 are biased off. The switchpoint of sensing inverter 38 is about 2.2V which is below $V_{high}$, the output of inverter 38 is substantially below the 2.2V switchpoint of inverter 40, and signal OUT is a logic high at VDD.

With sense amplifier 3 enabled, signal OUT responds rapidly to changes in the logic state of logic network 5. From the quiescent state of the sense amplifier just described, if one or more of the inputs I1 to I32 to logic network 5 switches to a logic high, then a corresponding number of associated n-channel transistors in logic network 5 switch on and become conductive. In response $V_{22}$ falls from $V_{high}$ as charge from sense node 22 is drained through logic network 5 and transistor 14. Initially, transistor 24 is conductive, but the current therethrough is inadequate to prevent a decrease in $V_{22}$. Also, initially, transistor 14 is fully biased at about $V_{high}$ and readily drains current from sense node 22 through logic network 5. However, as $V_{22}$ falls, the voltage on node 30 ($V_{30}$) increases due to the inverting action of inverter 29, and transistor 24 becomes more conductive. Also, as $V_{22}$ falls, the voltage on node 18 ($V_{18}$) falls, and transistor 14 becomes less conductive. In response to these changes, for a short time, transistor 24 supplies more current and transistor 14 drains less current, opposing the fall of $V_{22}$. Then after this short time, a new quiescent state is reached in which the impedance of transistor 24 is increased, the series impedance of transistor 14 and logic network 5 is decreased, and sense node 22 is at $V_{low}$ corresponding to a logic low.

During typical sensing by sense amplifier 3, such as in a PLA for a microprocessor, the inputs I1 to I32 will be changing with time, $V_{22}$ will vary between $V_{high}$ and $V_{low}$, and signal OUT will change in response to these inputs. Due to the limited swing on sense node 22, sense amplifier 3 responds rapidly to these changes. This is mainly because the parasitic capacitance on sense node 22, largely due to the drain capacitance of the 32 transistors in logic network 5, does not have to fully charge to VDD or fully discharge to ground when changing logic state from low to high, or vice versa.

It is a significant advantage of the present invention that the swing of sense node 22 in sense amplifier 3 remains substantially stable in response to a widely varying range of currents through logic network 5. The initial current through logic network 5 varies significantly with the number of parallel transistors turned on therein. The response of sense amplifier 3 varies with the number of transistors turned on in logic network 5. As the number of transistors turned on increases, the impedance of logic network 5 decreases. However, by the sensing apparatus of the invention, $V_{low}$ remains substantially constant regardless of the number of transistors that turn on in logic network 5. This is substantially a result of the non-linear current feedback provided by transistor 14 as modulated by node 18 coupled from sense node 22 in response to the significantly changing impedance of logic network 5. When many or all transistors in logic network 5 turn on, the initial current through logic network 5 and transistor 14 is large. Initially, in response to this large current, $V_{22}$ falls sharply and decreases slightly below $V_{low}$ for a short time. $V_{18}$ decreases substantially likewise. Thereby, transistor 14 becomes less conductive, and the decrease in conductivity is proportional to the number of transistors turned on in logic network 5. As a result, after this short time, $V_{22}$ increases to its quiescent voltage of $V_{low}$. As transistor 14 becomes less conductive, the voltage on virtual ground node 12 increases. Thus, when logic network 5 has a low impedance, as when many or all parallel transistors therein are on, transistor 14 is less conductive. Conversely, when logic network 5 has a high impedance, as when only one or two parallel transistors therein are on, transistor 14 is more conductive. This response of transistor 14 to changes in the inputs to logic network 5 is an important advantage of the invention.

When it is not necessary to sense logic network 5, sense amplifier 3 can be disable to significantly reduce power consumption. In addition, the logic state of signal OUT corresponding to the logic state of logic network 5 is latched onto sense node 22 when disabling sense amplifier 3. If prior to disabling, all inputs I1 to I32 to logic network 5 are at a logic low, then all of the parallel transistors in logic network 5 are off, and sense node 22 is at $V_{high}$. Therefore, signal OUT is at VDD. To disable sense amplifier 3, signal SAE is switched to a logic low, and *SAE is switched to a logic high, thereby biasing p-channel transistor 26 off, n-channel transistor 16 on, feedback transmission gate 20 off, and transmission gate 36 on. Transmission gate 20 isolates node 18 from sense node 22, and transistor 16 discharges $V_{18}$ to ground. Transistor 14 is thereby biased off. Transmission gate 36 transfers charge from node 42 to node 22 raising $V_{22}$ from $V_{high}$ to VDD. Inverter 40 supplies current for charging node 22 to VDD. The increase of $V_{22}$ to VDD switches transistor 28 off and transistors 32 and 34 on. $V_{30}$ is pulled down to ground, and transistor 24 is biased off. Thus, all direct current paths are substantially closed and signal OUT is latched onto sense node 22.

If prior to disabling sense amplifier 3, one or more inputs I1 to I32 to logic network 5 are at a logic high, then some of the parallel transistors in logic network 5 are on, and sense node 22 is at $V_{low}$. Therefore, signal OUT is at ground. After disabling sense amplifier 3, transmission gate 20 isolates node 18 from sense node 22, and transistor 16 discharges $V_{18}$ to ground. Transistor 14 is thereby biased off and prevents current flow through the conductive transistors in logic network 5. Transmission gate 36 transfers charge from node 22 to node 42 decreasing $V_{22}$ from $V_{low}$ to ground. Inverter 40 drains current for discharging node 22 to ground. The decrease of $V_{22}$ to ground switches transistor 28 on and transistors 32 and 34 off. $V_{30}$ is pulled up to VDD, and transistor 24 is biased on. However, because transistor 26 is switched off, no current flows through transistor 24. Thus, all direct current paths are substantially closed and signal OUT is latched onto sense node 22.

The latching of signal OUT onto sense node 22 during the disabling of sense amplifier 3 by the present invention is important for two reasons. First, it provides a means for disabling current flow through inverter 29. Second, if the inputs to logic network 5 have remained unchanged while sense amplifier 3 has been disabled, then a glitch in signal OUT is prevented when re-enabling sense amplifier 3. $V_{22}$ returns to the voltage level, either $V_{high}$ or $V_{low}$, corresponding to the unchanged inputs to logic network 5. Signal OUT does not falsely change while sense amplifier 3 is being enabled because $V_{22}$ is always either fully above or below the switchpoint of inverter 38, thereby precluding switching by either inverter 38 or 40.

There are further advantages to the present invention. Sense amplifier 3 can detect both high and low logic states with substantially equal noise margin and speed. This is possible because the switchpoint of sensing inverter 38 is substantially centered in the swing range of sense node 22. This is accomplished by sizing devices as described previously and further by designing the width-to-length ratio of the effective series combination of transistors 24 and 26 to be twice the ratio of an individual transistor in logic network 5. Furthermore, sense amplifier 3 has adequate noise margin, typically about 180 mV, over a wide range of device processing and operating conditions, and the swing on sense node 22 is substantially independent of the number of pull-down transistors that are conductive in logic network 5. Sense amplifier 3 uses two feedback loops in combination to achieve a stable input swing of only about 1V suitable for high-performance microprocessors and memories. Transistor 32 minimizes hot-carrier injection problems in inverter 29. No depletion transistors are needed or used. The latching feature during disabling of sense amplifier 3 is useful in applications in which a processor enters a standby state, for example a sleep state for a microprocessor, to avoid sense amplifier output glitches when leaving the standby state.

Although a particular embodiment of the invention has been described in the foregoing description, it will be apparent to one skilled in the art that numerous modifications and variations can be made to the present embodiment which still fall within the spirit and scope of the invention. For example, the parallel-transistor logic network can contain and number of transistors, either more or less than the 32 as used in the present embodiment. Additional devices could be added to the present embodiment without changing the spirit of the invention. There are numerous other possibilities for logic networks that can be connected to sense node 22 and virtual ground node 12. Accordingly, it is intended that all such variations and modifications as fall within the scope of the appended claims be included within the invention.

We claim:

1. An integrated circuit, comprising:
a logic network coupled between a sense node and a virtual ground node;
sensing means, coupled to said sense node, for detecting a logic state of said sense node corresponding to a voltage present on said sense node, said sensing means providing an output signal having a logic state corresponding to the logic state of said sense node;
charging means, coupled between said sense node and a first power supply terminal, for providing an impedance therebetween responsive to an impedance control signal;
feedback means, coupled to said sense node and said charging means, for providing said impedance control signal responsive to said sense node; and
discharging means, coupled between said virtual ground node and a second power supply terminal, for providing an impedance therebetween according to the voltage on said sense node.

2. The integrated circuit of claim 1 further comprising:
control means, coupled to the discharging means, for disabling the operation of said logic network.

3. The integrated circuit of claim 2 further comprising:
latching means, coupled to the sensing means, for coupling said output signal of said sensing means to said sense node when said logic network is disabled by said control means.

4. The integrated circuit of claim 1 wherein the sensing means, the charging means, the feedback means, and the discharging means comprise only enhancement-type transistors.

5. An integrated circuit, comprising:
a logic network coupled between a sense node and a virtual ground node;
sensing means, coupled to said sense node, for providing an output signal representative of a voltage present on said sense node;
a first inverter having an input coupled to said sense node and an output having a voltage corresponding to the voltage of aid sense node;
a first transistor having a control terminal coupled to said output of said first inverter, a first current terminal coupled to a first power supply terminal, and a second current terminal coupled to said sense node; and
a second transistor having a control terminal coupled to said sense node, a first current terminal coupled to said virtual ground node, and a second current terminal coupled to a second power supply terminal.

6. The integrated circuit of claim 5 wherein the switchpoint of said first inverter is substantially higher than the switchpoint of said sensing means.

7. The integrated circuit of claim 5 further comprising:
- a first transmission gate having a first input/output terminal coupled to said control terminal of said second transistor and a second input/output terminal coupled to said sense node, said first transmission gate controlled by a sense amplifier enable signal;
- a third transistor having a first current terminal coupled to said control terminal of said second transistor and a second current terminal coupled to the second power supply terminal, said third transistor controlled by said sense amplifier enable signal;
- a second transmission gate having a first input/output terminal coupled to said sense node and a second input/output terminal coupled to said output of said sensing means, said second transmission gate controlled by said sense amplifier enable signal; and
- a fourth transistor having a first current terminal coupled to said first power supply terminal and a second current terminal coupled to said first current terminal of said first transistor, said fourth transistor controlled by said sense amplifier enable signal.

8. The integrated circuit of claim 5 wherein said logic network comprises at least two transistors having independent control terminals, common first current terminals, and common second current terminals.

9. An integrated circuit, comprising:
- a logic network coupled between a sense node and a virtual ground node;
- sensing means, coupled to said sense node, for detecting a logic state of said sense node corresponding to a voltage present on said sense node, said sensing means providing an output signal having a logic state corresponding to the logic state of said sense node;
- charging means, coupled between said sense node and a first power supply terminal, for providing an impedance therebetween responsive to an impedance control signal;
- feedback means, coupled to said sense node and said charging means, for providing said impedance control signal responsive to said sense node;
- a discharging transistor having a first current terminal coupled to said virtual ground node, a second current terminal coupled to a second power supply terminal, and a control terminal coupled to said sense node, said discharging transistor providing an impedance between the virtual ground node and the second power supply terminal according to the voltage on said sense node;
- a first transmission gate having a first input/output terminal coupled to the control terminal of said discharging transistor and a second input/output terminal coupled to said sense node; and
- a second transmission gate having a first input/output terminal coupled to said output signal and a second input/output terminal coupled to said sense node.

* * * * *

UNITED STATES PATENT AND TRADEMARK OFFICE
CERTIFICATE OF CORRECTION

PATENT NO. : 4,972,102

DATED : November 20, 1990

INVENTOR(S) : Richard Reis, et. al.

It is certified that error appears in the above-identified patent and that said Letters Patent is hereby corrected as shown below:

Column 8, line 58, change "aid" to --said--

Signed and Sealed this

Twenty-ninth Day of December, 1992

*Attest:*

DOUGLAS B. COMER

*Attesting Officer*     *Acting Commissioner of Patents and Trademarks*